(12) United States Patent
Li et al.

(10) Patent No.: US 11,538,366 B2
(45) Date of Patent: Dec. 27, 2022

(54) DISPLAY PANEL AND DETECTING METHOD THEREOF

(71) Applicant: BOE Technology Group Co., Ltd., Beijing (CN)

(72) Inventors: Xiaolong Li, Beijing (CN); Meng Zhao, Beijing (CN); Zheng Liu, Beijing (CN); Chunyang Wang, Beijing (CN); Mingxin Zhang, Beijing (CN)

(73) Assignee: BOE Technology Group Co. Ltd., Beijing (CN)

( * ) Notice: Subject to any disclaimer, the term of this patent is extended or adjusted under 35 U.S.C. 154(b) by 221 days.

(21) Appl. No.: 16/916,910

(22) Filed: Jun. 30, 2020

(65) Prior Publication Data

US 2021/0012687 A1    Jan. 14, 2021

(30) Foreign Application Priority Data

Jul. 12, 2019    (CN) .......................... 201910627883.1

(51) Int. Cl.
*H01L 27/32*    (2006.01)
*H01L 51/52*    (2006.01)
(Continued)

(52) U.S. Cl.
CPC ............. *G09F 9/301* (2013.01); *G01B 7/003* (2013.01); *G01B 7/30* (2013.01); *G01N 27/041* (2013.01);
(Continued)

(58) Field of Classification Search
CPC ........... G09F 9/301; G01B 7/003; G01B 7/30; G01B 7/20; G01B 7/00; G01N 27/041; H01L 27/323; H01L 51/5284; H01L 2251/5338; H01L 27/3225; H01L 27/3272; G06F 1/1652; G06F 1/1677
See application file for complete search history.

(56) References Cited

U.S. PATENT DOCUMENTS

2013/0265262 A1*  10/2013  Jung .................. G06F 3/041
                                                                345/173
2017/0060189 A1    3/2017   Sohn et al.
(Continued)

FOREIGN PATENT DOCUMENTS

CN    106482631 A    3/2017
CN    106486039 A    3/2017
(Continued)

OTHER PUBLICATIONS

Office Action for corresponding Chinese Application No. 201910627883.1 dated Dec. 16, 2020.

*Primary Examiner* — Kyoung Lee
(74) *Attorney, Agent, or Firm* — ArentFox Schiff LLP; Michael Fainberg

(57) ABSTRACT

The present disclosure discloses a display panel and a detecting method thereof. By providing at least one resistance sensor in a bending region, an extending direction of the resistance sensor is perpendicular to an extending direction of an axis for bending and overlaps with the axis for bending. By electrically connecting the resistance sensor to a detecting circuit, a change of the resistance value of the resistance sensor can be reflected as a change of voltage.

10 Claims, 4 Drawing Sheets

(51) Int. Cl.
  *G09F 9/30* (2006.01)
  *G01B 7/00* (2006.01)
  *G01B 7/30* (2006.01)
  *G01N 27/04* (2006.01)

(52) U.S. Cl.
  CPC ........ *H01L 27/323* (2013.01); *H01L 51/5284* (2013.01); *H01L 2251/5338* (2013.01)

(56) References Cited

U.S. PATENT DOCUMENTS

2017/0060283 A1* 3/2017 Sohn ................. G06F 3/041
2018/0040678 A1 2/2018 Zhai

FOREIGN PATENT DOCUMENTS

| CN | 107195667 A | 9/2017 |
| CN | 108877526 A | 11/2018 |
| CN | 109786430 A | 5/2019 |

* cited by examiner

DISPLAY PANEL AND DETECTING METHOD THEREOF

CROSS-REFERENCE TO RELATED APPLICATIONS

This application claims priority to Chinese Patent Application No. 201910627883.1, filed on Jul. 12, 2019, which is hereby incorporated by reference in its entirety.

FIELD

The present disclosure relates to the field of flexible display technologies, in particular to a display panel and a detecting method thereof.

BACKGROUND

An Organic Light-Emitting Diode (OLED) display screen has the characteristics of high brightness, wide color gamut, high resolution, low power consumption, and the like, and is considered as the best choice for the next generation display. A flexible OLED has the characteristics of being bendable, not easily broken, light in weight and the like, which provides unlimited possibilities for displaying forms of the future display. In recent years, with the development of flexible OLED technology, flexible screens are getting closer and closer to us. Foldable mobile phones, curtain-like TVs, products combining a mobile phone and a computer, and the like will also be available to thousands of households in the near future.

SUMMARY

An embodiment in the present disclosure provides a display panel including:

a bending region, wherein the bending region has an axis for bending extending in a first direction, and the bending region includes at least one resistance sensor extending in a second direction perpendicular to the first direction and overlapping the axis in the bending region; and a detecting circuit electrically connected to the resistance sensor, wherein the detecting circuit is configured to detect a voltage change amount caused by a change of a resistance value of the resistance sensor when the bending region is bent around the axis.

In the display panel provided by the embodiment in the present disclosure, the display panel further includes: a display region and a peripheral region surrounding the display region, wherein the bending region divides the display region into two parts, and the resistance sensor is located in an overlapping region of the bending region and the peripheral region.

In the display panel provided by the embodiment in the present disclosure, an orthographic projection of the resistance sensor on the display panel is in a bow shape.

In the display panel provided by the embodiment in the present disclosure, the bending region includes multiple resistance sensors extending in the second direction and the respective resistance sensors are located in different film layers in the display panel.

In the display panel provided by the embodiment in the present disclosure, orthographic projections of the respective resistance sensors on the display panel overlap with one another.

In the display panel provided by the embodiment in the present disclosure, the display panel further includes a light-shielding metal layer, a source-drain metal layer, and a touch metal layer, wherein the light-shielding metal layer, the source-drain metal layer and the touch metal layer are stacked, and the resistance sensors are located in one or more of the light-shielding metal layer, the source-drain metal layer, or the touch metal layer.

In the display panel provided by the embodiment in the present disclosure, the light-shielding metal layer, the source-drain metal layer, and the touch metal layer are all provided with the resistance sensors.

In the display panel provided by the embodiment in the present disclosure, the display panel further includes: a first gate metal layer and a second gate metal layer that are stacked between the light-shielding metal layer and the source-drain metal layer, an anode metal layer, and a cathode metal layer between the source-drain metal layer and the touch metal layer;

wherein at least one layer of the first gate metal layer, the second gate metal layer, the anode metal layer or the cathode metal layer is provided with the resistance sensor.

In the display panel provided by the embodiment in the present disclosure, the first gate metal layer, the second gate metal layer, the anode metal layer and the cathode metal layer are all provided with the resistance sensors.

Correspondingly, an embodiment in the present disclosure also provides a detecting method for the display panel provided by the embodiment in the present disclosure, including:

detecting, by the detecting circuit, the voltage change amount caused by the change of the resistance value of the resistance sensor when the bending region is bent around the axis; and determining, by the detecting circuit, a bending angle, a position of a neutral layer, and a broken film layer of the display panel according to the voltage change amount.

In the detecting method provided by the embodiment in the present disclosure, determining, by the detecting circuit, the bending angle of the display panel according to the voltage change amount includes:

determining, by the detecting circuit, that the voltage change amount is larger, in the condition that the bending angle of the display panel is larger.

In the detecting method provided by the embodiment in the present disclosure, determining, by the detecting circuit, the position of the neutral layer of the display panel according to the voltage change amount includes:

determining, by the detecting circuit, that the neutral layer is located between a film layer in which one resistance sensor located and another film layer in which another resistance sensor located, in the condition that a voltage change amount caused by a change of a resistance value of the one resistance sensor increases, and a voltage change amount caused by a change of a resistance value of the another resistance sensor stacked on the one resistance sensor decreases.

In the detecting method provided by the embodiment in the present disclosure, determining, by the detecting circuit, a broken film layer of the display panel according to the voltage change amount includes:

determining, by the detecting circuit, that a film layer proximate to a resistance sensor with signal abnormality is a broken film layer in the condition that the detecting circuit detects the resistance sensor with signal abnormality.

DETAILED DESCRIPTION OF THE EMBODIMENTS

Figure 1:
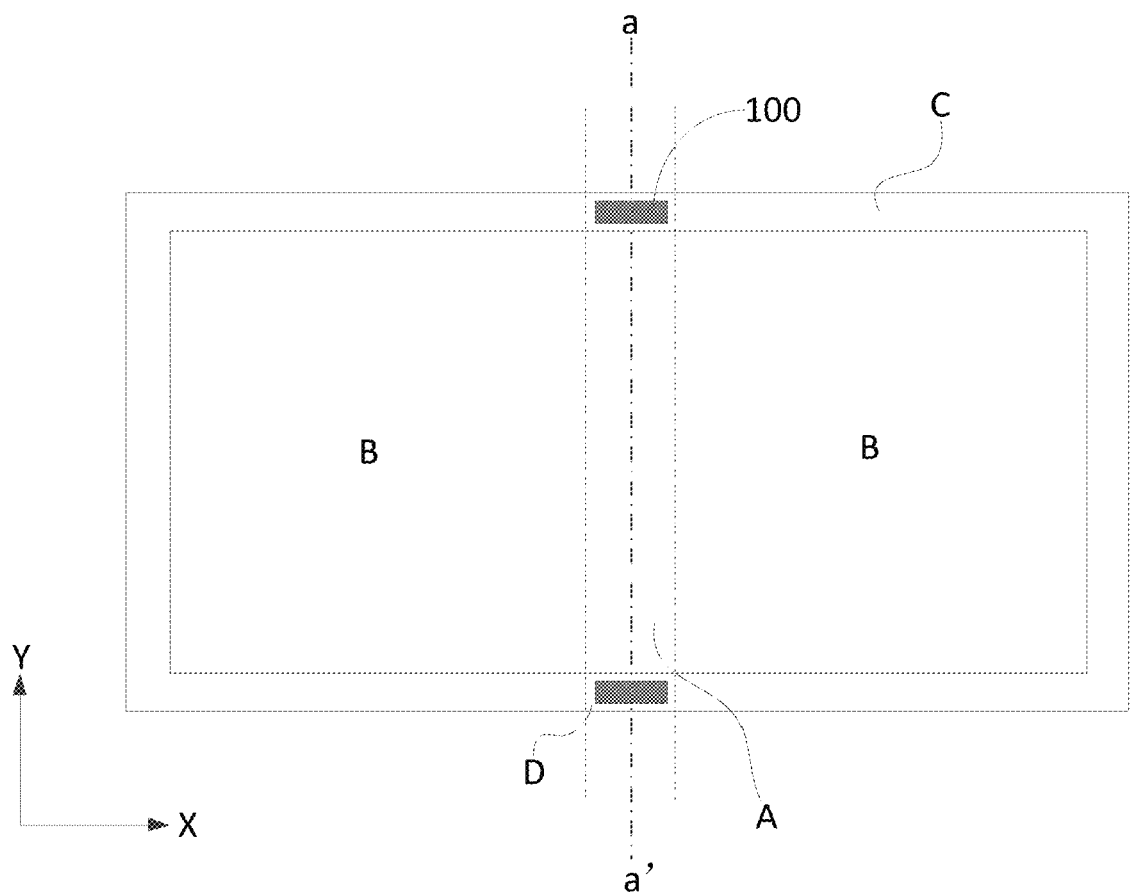
FIG. 1 is a schematic diagram of a top view structure of a display panel provided by embodiments in the present disclosure.

In order to make the objectives, technical solutions and advantages of the present disclosure clearer, the specific implementation of a display panel and a detecting method thereof provided by the embodiments in the present disclosure will be described in detail below with reference to drawings. It should be understood that the preferred embodiments described below are only used to illustrate and explain the present disclosure, but not to limit the present disclosure. In the case of no conflict, the embodiments in the present application and the features in the embodiments may be combined with each other. It should be noted that the thickness and shape of a film in each layer in the drawings do not reflect the true scale of the display panel, for the only purpose of illustrating the contents of the present disclosure. The same or similar reference signs indicate the same or similar elements or elements with the same or similar functions throughout.

The present disclosure will be described in detail below with reference to drawings. It should be noted that the embodiments are for better explanation of the present disclosure, but do not limit the present disclosure.

The introduction of a sensor for sensing a bending state into a foldable display screen or a curly display screen has become an application requirement for sensing the bending state. At present, a commonly used method is to attach a flexible bending sensor directly to a screen to sense the bending state. However, the thickness of the display screen prepared by this method will be greatly increased, which is not conducive to the bending of the screen, and when the bending sensor is attached to the screen, it will increase the manufacturing process, costs, and power consumption.

In view of the above, an embodiment in the present disclosure provides a display panel, as shown in FIG. 1, including a bending region A. The bending region A has an axis aa' for bending extending in a first direction Y, and includes at least one resistance sensor 100 extending in a second direction X and overlapping the axis aa' for bending in the bending region A. The first direction Y is perpendicular to the second direction X.

Wherein the display panel further includes a detecting circuit (which is not shown in FIG. 1) electrically connected to the resistance sensor 100, wherein the detecting circuit is configured to detect a voltage change amount caused by a change of a resistance value of the resistance sensor 100 when the bending region A is bent around the axis.

According to the display panel provided by the embodiments in the present disclosure, as shown in FIG. 1, by providing at least one resistance sensor 100 in the bending region A, the resistance sensor 100 can be added without increasing the thickness of the display panel, which will not increase the manufacturing process, thereby reducing costs. Since an extending direction of the resistance sensor 100 is perpendicular to an extending direction of an axis aa' for bending and overlaps with the axis aa' for bending, the resistance value of the resistance sensor 100, which is deformed under the action of stretching or squeezing, can be changed, in the condition that the display panel is bent around the axis aa' for bending of the bending region. By electrically connecting the resistance sensor 100 to a detecting circuit, a change of the resistance value of the resistance sensor 100 can be reflected as a change of voltage. Therefore, the detecting circuit senses a voltage change amount caused by the change of the resistance value of the resistance sensor 100 during the bending process, so that a bending angle of the flexible display panel can be detected. In addition, a position of a broken film layer and a position of a neutral layer can also be determined by sensing a change of the resistance value of the resistance sensor 100, when the display panel is bent.

Further, in some embodiments, as shown in FIG. 1, the display panel includes: a display region B and a peripheral region C surrounding the display region B, wherein the bending region A divides the display region B into two parts, and the resistance sensor 100 is located in an overlapping region D of the bending region A and the peripheral region C. Of course, in some embodiments, the resistance sensor 100 can be located at any position in the bending region A, as long as the bending region has a space for accommodating the resistance sensor 100.

Figure 2:
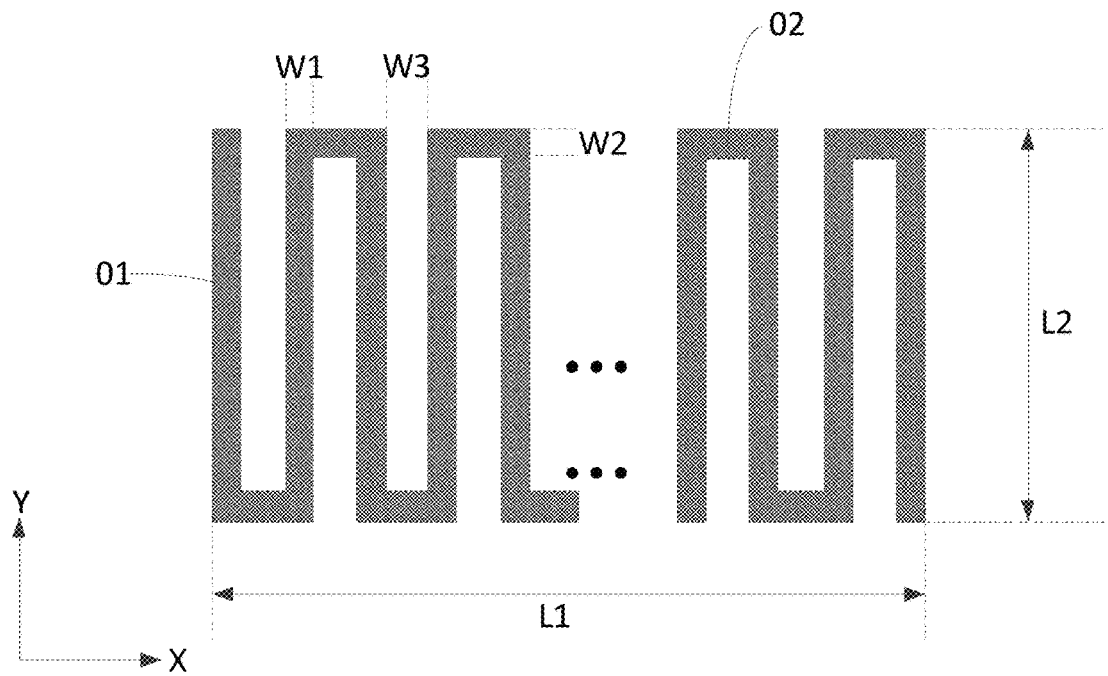
FIG. 2 is a schematic diagram of a top view structure of a resistance sensor provided by the embodiments in the present disclosure.

Further, in some embodiments, as shown in FIG. 2, an orthographic projection of the resistance sensor 100 on the display panel is in a bow shape. In some embodiments, as shown in FIG. 2, the resistance sensor 100 provided by the embodiments in the present disclosure has a bending structure, wherein the bending structure includes first bending sensing portions 01 and second bending sensing portions 02. In this way, when the display panel is bent, the first bending sensing portions 01 and the second bending sensing portions 02 are simultaneously squeezed or stretched, so that a change amount of the resistance value of the resistance sensor 100 will be large, that is, the detecting sensitivity of the detecting circuit can be increased in the condition that the detecting circuit senses that the voltage change amount caused by the change of the resistance value of the resistance sensor 100 is large, which is advantageous for detecting a bending state of the display panel.

Of course, in some embodiments, the resistance sensor provided by the embodiments in the present disclosure may have another bending structure or a block structure, which is not limited herein. The present disclosure preferably adopts the bending structure shown in FIG. 2.

Further, in some embodiments, in the display panel provided by the embodiments in the present disclosure, as shown in FIG. 2, a length L1 of the resistance sensor 100 along the second direction X can be 30 mm-50 mm, a length L2 of the first bending sensing portion 01 along the first direction Y can be 90 μm-120 μm, a width W1 of the first bending sensing portion 01 along the second direction X can be 6 μm-9 μm, a width W2 of the second bending sensing portion 02 along the first direction Y can be 6 μm-9 μm, and a width W3 between two adjacent first bending sensing portions 01 can be 6 μm to 9 μm.

Figure 3:
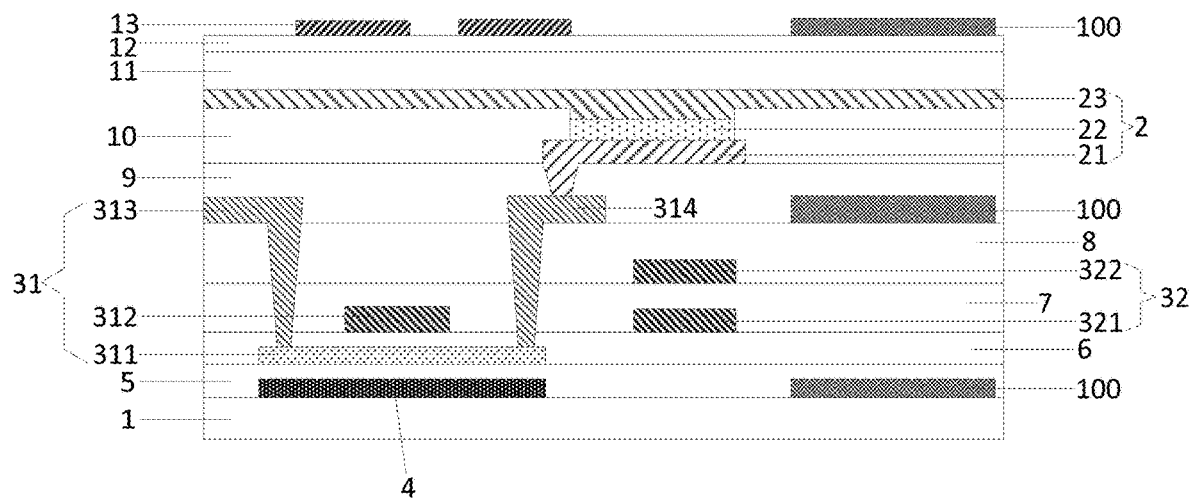
FIG. 3 is a schematic diagram of a cross-sectional structure of a display panel provided by the embodiments in the present disclosure.

Taking the display panel provided by the embodiments in the present disclosure as a top light-emitting display panel as an example, as shown in FIG. 3, the top light-emitting display panel generally includes a top light-emitting device 2 formed on a base substrate 1 and located in the display region B, and a driving circuit 3 for driving the top light-emitting device 2 to emit light, wherein the driving circuit 3 is located between the top light-emitting device and the base substrate 1 and the driving circuit 3 includes a TFT driving circuit 31 and a storage capacitor 32.

In some embodiments, as shown in FIG. 3, the TFT driving circuit 31 includes an active layer 311, a gate 312 located in a first gate metal layer, a source 313, and a drain 314 located in a source-drain metal layer that are stacked, wherein the source 313 and the drain 314 are electrically connected to the active layer 311, respectively. The storage capacitor 32 includes a first electrode layer 321 and a second electrode layer 322, wherein the first electrode layer 321 and the gate 312 are disposed in the same layer. That is, the first electrode layer 321 and the gate 312 are located in the first gate metal layer, and the second electrode layer 322 is located in the second gate metal layer. The top light-emitting device 2 includes an anode 21, a light-emitting layer 22, and a cathode 23 that are sequentially stacked above the driving circuit 3, wherein the anode 21 is electrically connected to the drain 314. In some embodiments, the anode 21 can be a stacked structure of a transparent electrode layer/a reflective metal layer/a transparent electrode layer, the material of the transparent electrode layer can be ITO, and the material of the reflective metal layer can be Ag.

In some embodiments, as shown in FIG. 3, the display panel provided by the embodiments in the present disclosure further includes: a light-shielding metal layer 4 between the base substrate 1 and the active layer 311, a buffer layer 5 between the light-shielding metal layer 4 and the active layer 311, a first gate insulating layer 6 between the active layer 311 and the gate 312, a second gate insulating layer 7 between the gate 312 and the second electrode layer 322, an interlayer insulating layer 8 between the second electrode layer 322 and the source-drain metal layer in which the source 313 and the drain 314 located, a planarization layer 9 between the source-drain metal layer, in which the source 313 and the drain 314 are located, and the anode 21, a pixel defining layer 10 defining each opening region in the display panel, a TFE encapsulation layer 11 on the cathode 23, and an insulating layer 12 located in the TFE encapsulation layer 11. Wherein the TFE encapsulation layer 11 generally includes an inorganic layer, an organic layer, and an inorganic layer that are stacked and the material of the insulating layer 12 can be SiNx. When the display panel is integrated with a touch function, the display panel further includes a touch electrode 13 on the insulating layer 12. Of course, in some embodiments, the display panel also includes other functional film layers well known to those skilled in the art, which will not be described in detail herein.

It should be noted that, in the case where the display panel provided by the embodiments in the present disclosure is a self-luminous display panel, the TFT driving circuit 31 generally includes one driving TFT and at least one switching TFT.

In some embodiments, the driving circuit 3 for driving the top light-emitting device to emit light can have a 2T1C structure including two thin film transistors and a storage capacitor, or a 7T1C structure including seven thin film transistors and a storage capacitor. These structures are circuit structures well known to those skilled in the art, and will not be described in detail herein.

Further, in some embodiments, in the display panel provided by the embodiments in the present disclosure, the number of the resistance sensors is multiple, and the respective resistance sensors are located in different film layers in the display panel. In this way, when the display panel is bent, the detecting circuit can determine the corresponding voltage change amount according to the change of the resistance value of each resistance sensor, and determine a bending angle, a position of the neutral layer, and the broken film layer of the display panel according to each voltage change amount.

Further, in some embodiments, in the display panel provided by the embodiments in the present disclosure, as shown in FIG. 3, orthographic projections of the resistance sensors 100 on the display panel overlap with one another.

Further, in some embodiments, in the display panel provided by the embodiments in the present disclosure, as shown in FIG. 3, the display panel includes a light-shielding metal layer 4, a source-drain metal layer, i.e., the film layer in which the source 313 and the drain 314 are located, and a touch metal layer, i.e., the film layer in which the touch electrode 13 is located, that are stacked. The resistance sensor 100 is located in one or more of the light-shielding metal layer 4, the source-drain metal layer, i.e., the film layer in which the source 313 and the drain 314 are located, or the touch metal layer, i.e., the film layer in which the touch electrode 13 is located. In some embodiments, in the condition that the bending region A includes only one resistance sensor 100, the resistance sensor 100 can be in a same layer and made of a same material as any one of the light shielding metal layer 4, the source-drain metal layer, i.e., the film layer in which the source 313 and the drain 314 are located, and the touch metal layer, i.e., the film layer in which the touch electrode 13 is located. In the condition that the bending region A includes a plurality of resistance sensors 100, the resistance sensors 100 can be in same layers and made of same materials as multiple layers of the light-shielding metal layer 4, the source-drain metal layer, i.e., the film layer in which the source 313 and the drain 314 are located, and the touch metal layer, i.e., the film layer in which the touch electrode 13 is located. In this way, by manufacturing the resistance sensor 100 on the existing metal layer of the display panel, the resistance sensor 100 can be added without increasing the thickness of the display panel, which will not increase the manufacturing process, thereby reducing costs.

It should be noted that, compared with the bending region A including only one resistance sensor 100, in the condition that the bending region A includes a plurality of resistance sensors 100, if a metal wire of a resistance sensor 100 in any layer is broken due to bending, it does not affect other resistance sensors 100 to detect the bending state of the display panel, which can improve the yield of the display panel during application.

Further, in some embodiments, in the display panel provided by the embodiments in the present disclosure, as shown in FIG. 3, the light-shielding metal layer 4, the source-drain metal layer, i.e., the film layer in which the source 313 and the drain 314 are located, and the touch metal layer, i.e., the film layer in which the touch electrode 13 is located are each provided with a resistance sensor 100. In this way, when the display panel is bent, the resistance sensors 100 on the above three metal layers can be used to determine a bending angle, a position of the neutral layer, and a broken film layer of the display panel.

The following describes in detail how to determine the bending angle of the display panel, the position of the neutral layer, and the broken film layer according to the resistance sensors 100 in the three metal layers shown in FIG. 3.

Figure 4:
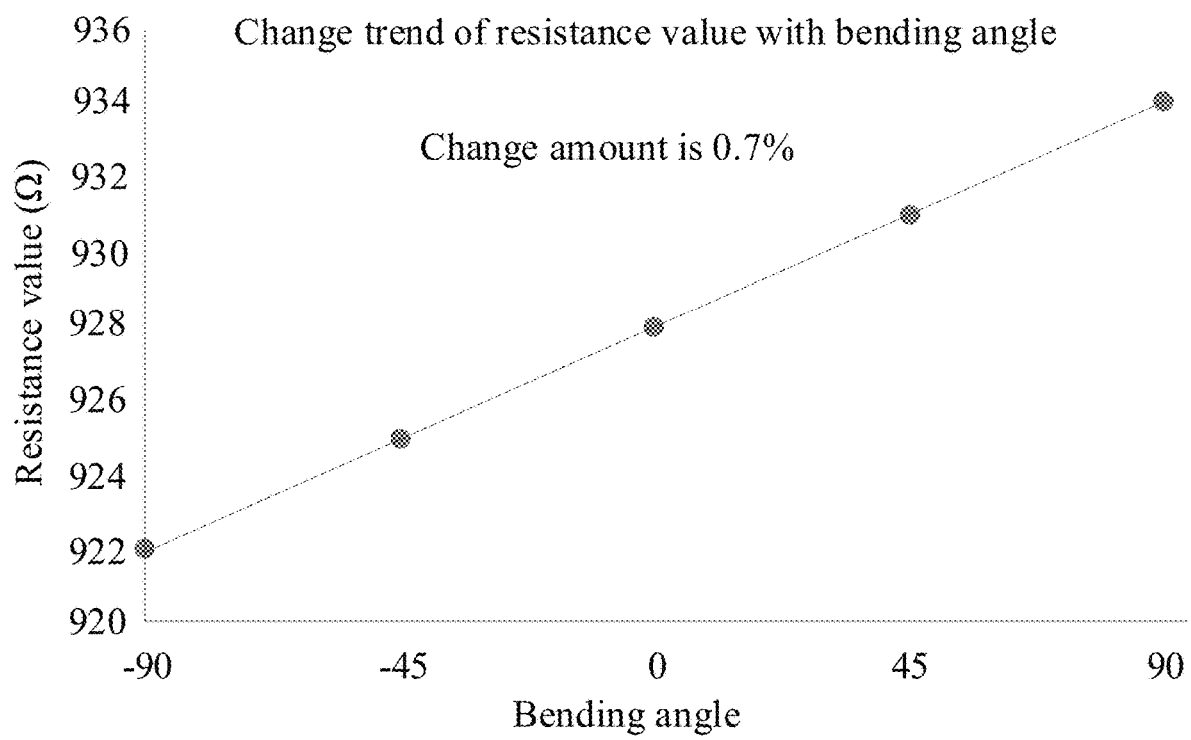
FIG. 4 is a graph showing the relationship between a resistance value of a resistance sensor and a bending angle provided by the embodiments in the present disclosure.

In some embodiments, as shown in FIGS. 1 and 3, when the display panel is bent around the axis aa' for bending, the resistance sensor 100 is stretched or squeezed along its extending direction, i.e., the second direction X. As the bending state changes, the resistance value of the resistance sensor 100 changes, and the detecting circuit converts the resistance value change into a voltage change, that is, the detecting circuit determines the corresponding voltage change amount according to the change of the resistance value of each resistance sensor 100, and can determine the bending angle of the display panel according to the determined voltage change amount, wherein the change of the resistance value is proportional to the bending angle. As shown in FIG. 4, FIG. 4 shows the relationship between the resistance value of the resistance sensor 100 and the bending angle. The larger the bending angle, the larger the resistance value and the larger the voltage change amount. Therefore, during the bending process of the display panel, the larger the voltage change amount, the larger the determined bending angle of the display panel is. Therefore, the display panel provided by the embodiments in the present disclosure can realize the determination of the bending state of the display panel.

Figure 5:
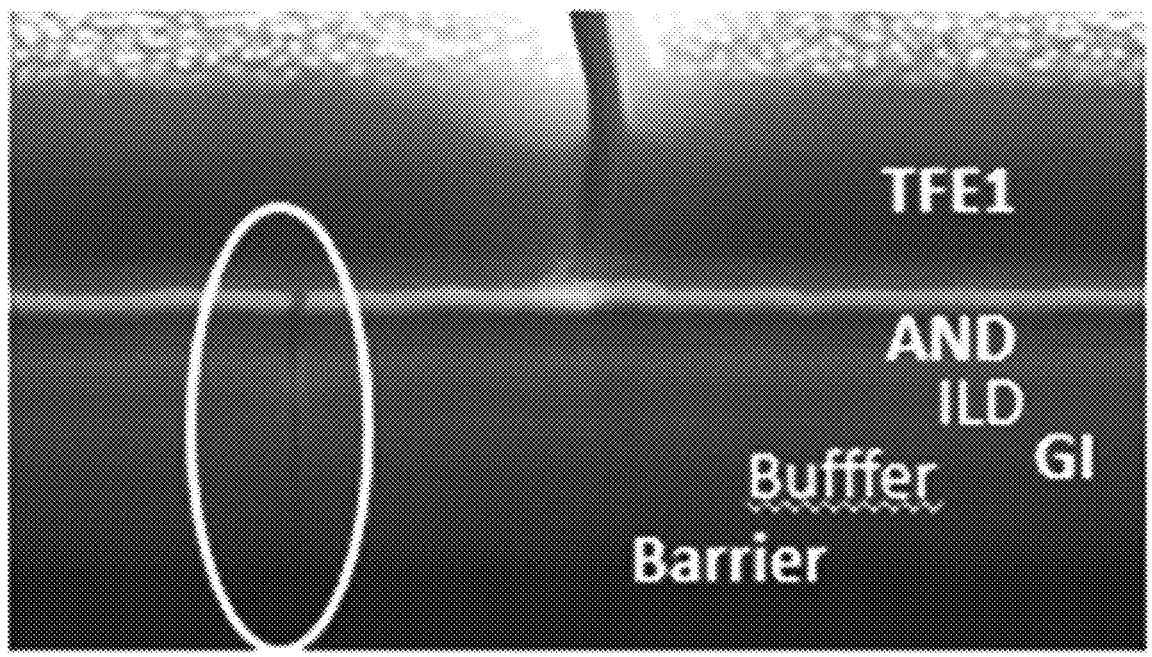
FIG. 5 is a schematic diagram of a cross-sectional structure of a broken film layer in a display panel provided by the embodiments in the present disclosure.

In addition, most of the film layers in the bending region A are inorganic insulating layers, such as the buffer layer 5, the first gate insulating layer 6, the second gate insulating layer 7, the interlayer insulating layer 8, and the TFE encapsulation layer 11, etc. Due to the thin thickness of these films, they are easily broken during the bending process of the display panel. As shown in FIG. 5, a broken crack path is in the white circle in FIG. 5. The display panel provided with the resistance sensor provided by the embodiments in the present disclosure can also detect a broken film layer during the bending process of the display panel. In some embodiments, in the condition that the display panel is bent around the axis aa' for bending, it can be determined that the inorganic film layer proximate to the touch metal layer is broken, that is, the TFE encapsulation layer 11 is broken, if signal abnormality in a resistance sensor 100 is detected by the detecting circuit, for example, signal abnormality in the resistance sensor 100 on the touch metal layer (the touch electrode layer 13) is detected. This is because in the condition that the TFE encapsulation layer 11 is broken, a crack will spread in a direction from the TFE encapsulation layer 11 to the resistance sensor 100, resulting in abnormality of the resistance sensor 100 on the touch metal layer, such as being broken. Thus, signal abnormality in the resistance sensor 100 on the touch metal layer can be detected. If the resistance sensor 100 in the source-drain metal layer, i.e., the film layer in which the source electrode 313 and the drain electrode 314 are located, has signal abnormality, it can be determined that the interlayer insulating layer 8 is broken. If the resistance sensor 100 in the light-shielding metal layer 4 has signal abnormality, it can be determined that the buffer layer 5 is broken. After determining a broken film layer according to each resistance sensor 100, the easy-to-break film layer can be improved accordingly when designing and manufacturing the same subsequently. Therefore, the display panel provided by the embodiments in the present disclosure can determine a broken film layer during the bending process of the display panel, and provide technical support for subsequent design.

Of course, the embodiments in the present disclosure can also determine a position of a neutral layer in the bending region. During the bending process of a material, the outer layer of the material is stretched and the inner layer of the material is squeezed. There will inevitably be a transition layer on the cross section of the material that is neither pulled nor compressed with the stress being almost equal to zero. The transition layer is called a neutral layer of the material. The length of the neutral layer during the bending process is the same as the length of the neutral layer before bending and remains unchanged. The neutral layer is a benchmark for calculating an unfolding length of the bending piece, and provides technical support for the design of the subsequent stacked layer structure. Therefore, it is important to determine a position of the neutral layer of the display panel during the bending process. As shown in FIG. 3, the light-shielding metal layer 4, the source-drain metal layer, i.e., (the film layer in which the source 313 and the drain 314 are located and the touch metal layer, i.e., the film layer in which the touch electrode 13 is located, are each provided with a resistance sensor 100. Since the resistance sensor 100 will be squeezed and stretched during the bending process, the resistance value decreases when the resistance sensor 100 is squeezed, and the resistance value increases when the resistance sensor 100 is stretched. Therefore, for two stacked resistance sensors 100, such as two resistance sensors 100 located in the light-shielding metal layer 4 and the source-drain metal layer, respectively, if the resistance value of one resistance sensor 100 increases, the corresponding voltage change amount increases, and if the resistance value of the other resistance sensor 100 decreases, the corresponding voltage change amount decreases, then there must be a film layer that is not squeezed and stretched between the two resistance sensors 100, that is a neutral layer. Therefore, it can be determined that a neutral layer is located between the light-shielding metal layer 4 and the source-drain metal layer. Similarly, for two resistance sensors 100 in the touch metal layer and the source-drain metal layer, respectively, during the bending process, if the resistance value of one resistance sensor 100 increases, and the resistance value of the other resistance sensor 100 decreases, it can be determined that a neutral layer is located between the touch metal layer and the source-drain metal layer. Therefore, the display panel provided by the embodiment in the present disclosure can determine a position of a neutral layer in the bending region.

Further, in some embodiments, as shown in FIG. 3, the display panel further includes a first gate metal layer, i.e., the film layer in which the gate 312 is located, and a second gate metal layer, i.e., the film layer in which the second electrode layer 322 is located, that are stacked between the light-shielding metal layer 4 and the source-drain metal layer, i.e., the film layer in which the source 313 and the drain 314 are located, and an anode metal layer, i.e., the film layer in which an anode 21 is located, and a cathode metal layer, i.e., the film layer in which a cathode 23 is located, between the source-drain metal layer, i.e., the film layer in which the source 313 and the drain 314 are located, and the touch metal layer, i.e., the film layer in which the touch electrode 13 is located.

In order to add a resistance sensor(s) without increasing the thickness of the display panel, at least one layer of the first gate metal layer (the film layer in which the gate 312 is located), the second gate metal layer (the film layer in which the second electrode layer 322 is located), the anode metal layer (the film layer in which the anode 21 is located) or the cathode metal layer (the film layer in which the cathode 23 is located) is provided with a resistance sensor, which will not increase the manufacturing process, thereby reducing costs. In this way, the accuracy for determining positions of a broken film layer and a neutral layer in the bending process of the display panel can be improved. The specific detecting principle is the same as the detecting principle shown in FIG. 3, which will not be described in detail herein.

Further, in some embodiments, in order to more accurately determine the position of the broken film layer during the bending process of the display panel and the specific position of the neutral layer, in the display panel provided by the embodiments in the present disclosure, the first gate metal layer, the second gate metal layer, the anode metal layer, and the cathode metal layer are each provided with a resistance sensor. The specific detecting principle is the same as the detecting principle shown in FIG. 3, which will not be described in detail herein.

It should be noted that the display panel provided by the embodiments in the present disclosure is a flexible display panel, and the flexible display panel can be a panel for detection or a factory panel. When the flexible display panel is a panel for detection, before leaving the factory, a plurality of resistance sensors can be each made by using a same material in a same layer of the respective existing metal layers in the display panel to determine the bending angle, the position of the broken film layer and the position of the neutral layer of the flexible display panel to provide technical support for subsequent design. When the flexible display panel is a factory panel, the bending region in the factory panel may or may not be provided with a resistance sensor. Since the resistance sensor is mainly used for detection, when the factory panel has a resistance sensor, the function of the resistance sensor may not be used, which does not affect the normal use of the display panel.

A method for manufacturing the display panel provided in FIG. 3 according to an embodiment in the present disclosure will be described below.

Figure 6A:
FIGS. 6A-6C are schematic diagrams of cross-sectional structures of a manufacture method for the display panel shown in FIG. 3 after performing each step.

(1) A base substrate 1 is cleaned. The base substrate 1 can be a glass substrate, wherein a PI film layer with a thickness of about 5 µm-10 µm is coated on a surface of the base substrate 1, and then a light-shielding metal layer 4 is deposited by a magnetron sputtering process. Wherein a material of the light-shielding metal layer 4 can be Mo metal. A resistance sensor 100 is manufactured in the bending region A by using a same material in a same layer as the light-shielding metal layer 4 while manufacturing the light-shielding metal layer 4, as shown in FIG. 6A.

Figure 6B:
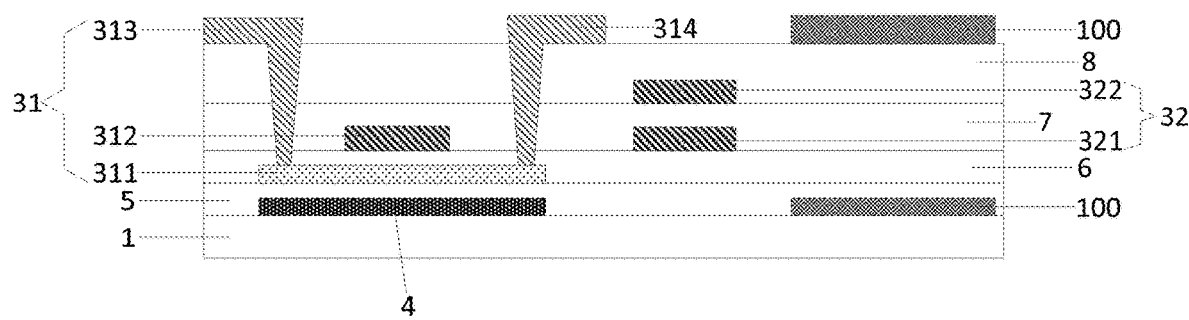

(2) Each film layer from a buffer layer 5 to a source-drain metal layer is sequentially formed on the light-shielding metal layer 4, and the resistance sensor 100 is manufactured in the bending region A by using a same material in a same layer as a source 313 and a drain 314 while manufacturing the source 313 and the drain 314, as shown in FIG. 6B. In some embodiments, a material of the source 313 and the drain 314 can be a Ti/Al/Ti composite metal material, and the thickness of which can be 500 nm-700 nm.

Figure 6C:
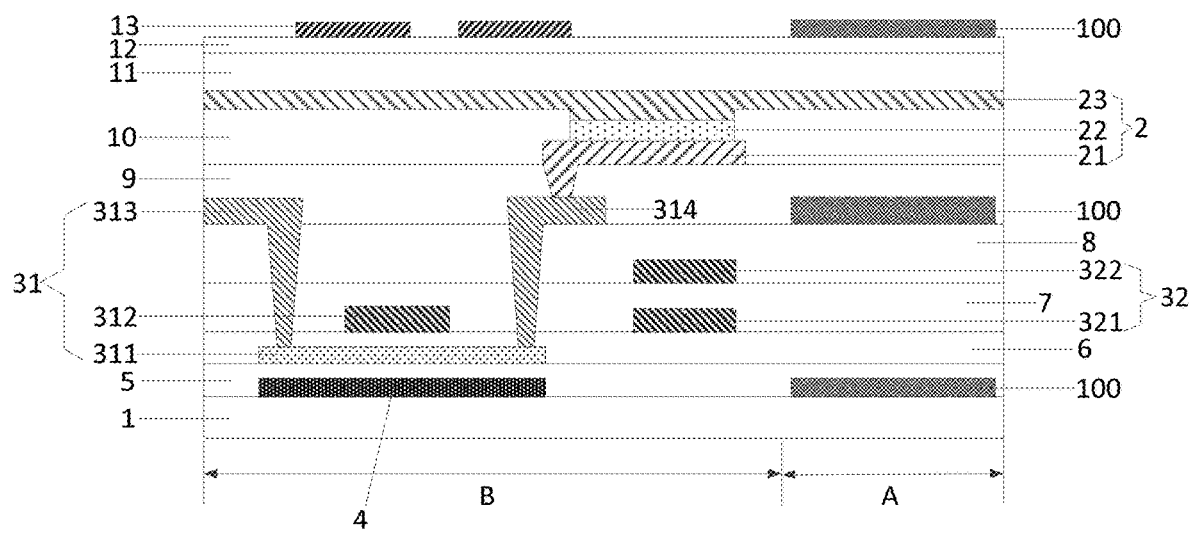

(3) A planarization layer 9 is formed on the source-drain metal layer. An anode 21, a light-emitting layer 22, and a cathode 23 are sequentially formed on the planarization layer 9. A TFE encapsulation layer 11 is formed on the cathode 23, an insulating layer 12 is formed on the TFE encapsulation layer 11. A touch electrode 13 is formed on the insulating layer 12. And the resistance sensor 100 is manufactured in the bending region A by using a same material in a same layer as the touch electrode 13 while manufacturing the touch electrode 13, as shown in FIG. 6C. In some embodiments, a material of the touch electrode 13 can be a Ti/Al/Ti composite metal material, and the thickness of which can be 300 nm-500 nm.

Through the above steps (1)-(3), the display panel provided in FIG. 3 according to the embodiments in the present disclosure can be prepared.

Based on the same inventive concept, an embodiment in the present disclosure also provides a detecting method for the display panel, including:

detecting, by the detecting circuit, the voltage change amount caused by the change of the resistance value of the resistance sensor when the bending region is bent around the axis; and determining, by the detecting circuit, a bending angle, a position of a neutral layer, and a broken film layer of the display panel according to the voltage change amount.

In the detecting method for the display panel provided by the embodiments in the present disclosure, by electrically connecting the resistance sensor to the detecting circuit, in the bending process of the display panel, a change of the resistance value of the resistance sensor can be reflected as a change of voltage. Therefore, the detecting circuit senses a voltage change amount caused by the change of the resistance value of the resistance sensor during the bending process, so that a bending angle, a position of the broken film layer and a position of the neutral layer of the flexible display panel can be determined.

Further, in some embodiments, in the detecting method provided by the embodiments in the present disclosure, the determining, by the detecting circuit, the bending angle of the display panel according to the voltage change amount can include:

determining, by the detecting circuit, that the voltage change amount is larger, in the condition that the bending angle of the display panel is larger.

Further, in some embodiments, in the detecting method provided by the embodiments in the present disclosure, the determining, by the detecting circuit, the position of the neutral layer of the display panel according to the voltage change amount can include:

determining, by the detecting circuit, that the neutral layer is located between a film layer in which one resistance sensor located and another film layer in which another resistance sensor located, in the condition that a voltage change amount caused by a change of a resistance value of the one resistance sensor increases, and a voltage change amount caused by a change of a resistance value of the another resistance sensor stacked on the one resistance sensor decreases.

Further, in some embodiments, in the detecting method provided by the embodiments in the present disclosure, the determining, by the detecting circuit, a broken film layer of the display panel according to the voltage change amount can include:

determining, by the detecting circuit, that a film layer proximate to a resistance sensor with signal abnormality is a broken film layer in the condition that the detecting circuit detects the resistance sensor with signal abnormality.

In some embodiments, the principle of the detecting method for the display panel can refer to the detecting principle described in the display panel, which will not be described in detail herein.

According to the display panel and the detecting method thereof provided by the embodiments in the present disclosure, by providing at least one resistance sensor in a bending region, a resistance sensor(s) can be added without increasing the thickness of the display panel, which will not increase the manufacturing process, thereby reducing costs. Since an extending direction of the resistance sensor is perpendicular to an extending direction of an axis for bending and overlaps with the axis for bending, when the display panel is bent around the axis for bending of the bending region, the resistance sensor(s) is deformed under the action of stretching or squeezing, which can change the resistance value of the resistance sensor. By electrically connecting the resistance sensor to the detecting circuit, a change of the resistance value of the resistance sensor can be reflected as a change of voltage. Therefore, the detecting circuit senses a voltage change amount caused by the change of the resistance value of the resistance sensor during the bending process, so that a bending angle of the flexible display panel can be detected. In addition, a position of the broken film layer and a position of the neutral layer can also be determined by sensing a change of a resistance value of a resistance sensor, when the display panel is bent.

Obviously, those skilled in the art can make various modifications and variations to the present disclosure without departing from the spirit and scope of the present disclosure. Thus, if these modifications and variations of the present disclosure fall within the scope of the claims of the present disclosure and the equivalent art, the present disclosure is also intended to include these modifications and variations.

What is claimed is:

1. A display panel, comprising:
   a bending region, wherein the bending region has an axis for bending extending in a first direction, and the bending region comprises at least one resistance sensor extending in a second direction perpendicular to the first direction and overlapping the axis;
   a detecting circuit electrically connected to the resistance sensor, wherein the detecting circuit is configured to detect a voltage change amount caused by a change of a resistance value of the resistance sensor when the bending region is bent around the axis;
   a light-shielding metal layer;
   a source-drain metal layer; and
   a touch metal layer;
   wherein the bending region comprises multiple resistance sensors extending in the second direction and the respective resistance sensors are located in different film layers in the display panel;
   orthographic projections of the respective resistance sensors on the display panel overlap with one another; and
   the light-shielding metal layer, the source-drain metal layer and the touch metal layer are stacked, and the resistance sensors are located in one or more of the light-shielding metal layer, the source-drain metal layer, or the touch metal layer.

2. The display panel according to claim 1, further comprising:
   a display region; and
   a peripheral region surrounding the display region;
   wherein the bending region divides the display region into two parts, and the resistance sensor is located in an overlapping region of the bending region and the peripheral region.

3. The display panel according to claim 1, wherein an orthographic projection of the resistance sensor on the display panel is in a bow shape.

4. The display panel according to claim 1, wherein the light-shielding metal layer, the source-drain metal layer, and the touch metal layer are all provided with the resistance sensors.

5. The display panel according to claim 4, further comprising:
   a first gate metal layer; and a second gate metal layer stacked between the light-shielding metal layer and the source-drain metal layer;
   an anode metal layer between the source-drain metal layer and the touch metal layer; and
   a cathode metal layer between the source-drain metal layer and the touch metal layer;
   wherein at least one layer of the first gate metal layer, the second gate metal layer, the anode metal layer, or the cathode metal layer is provided with the resistance sensor.

6. The display panel according to claim 5, wherein the first gate metal layer, the second gate metal layer, the anode metal layer, and the cathode metal layer are all provided with the resistance sensors.

7. A detecting method for the display panel according to claim 1, comprising:
   detecting, by the detecting circuit, the voltage change amount caused by the change of the resistance value of the resistance sensor when the bending region is bent around the axis; and
   determining, by the detecting circuit, a bending angle, a position of a neutral layer, and a broken film layer of the display panel according to the voltage change amount.

8. The detecting method according to claim 7, wherein determining, by the detecting circuit, the bending angle of the display panel according to the voltage change amount, comprises:
   determining, by the detecting circuit, that the voltage change amount is larger, in the condition that the bending angle of the display panel is larger.

9. The detecting method according to claim 7, wherein determining, by the detecting circuit, the position of the neutral layer of the display panel according to the voltage change amount comprises:
   determining, by the detecting circuit, that the neutral layer is located between a film layer in which one resistance sensor located and another film layer in which another resistance sensor located, in the condition that a voltage change amount caused by a change of a resistance value of the one resistance sensor increases, and a voltage change amount caused by a change of a resistance value of the another resistance sensor stacked on the one resistance sensor decreases.

10. The detecting method according to claim 7, wherein determining, by the detecting circuit, a broken film layer of the display panel according to the voltage change amount comprises:
    determining, by the detecting circuit, that a film layer proximate to a resistance sensor with signal abnormality is a broken film layer in the condition that the detecting circuit detects the resistance sensor with signal abnormality.

* * * * *